United States Patent [19]

Mizuno et al.

[11] Patent Number: 5,286,814

[45] Date of Patent: Feb. 15, 1994

[54] HEAT-RESISTANT STRETCHED FILM AND PRODUCTION PROCESS THEREOF

[75] Inventors: Toshiya Mizuno; Yoshikichi Teramoto; Takeshi Saito, all of Tsuchiura; Juichi Wakabayashi, Tamari; Yoshikatsu Satake, Iwaki; Ken Kashiwadate, Iwaki; Takayuki Katto, Iwaki, all of Japan

[73] Assignee: Kureha Kagaku Kogyo K. K., Tokyo, Japan

[21] Appl. No.: 690,318

[22] Filed: Apr. 26, 1991

Related U.S. Application Data

[63] Continuation of Ser. No. 358,045, May 30, 1989, abandoned.

[30] Foreign Application Priority Data

Jun. 13, 1988 [JP] Japan ................... 63-143611
Jan. 20, 1989 [JP] Japan ................... 1-9796

[51] Int. Cl.$^5$ .................. C08G 75/14; C08F 283/00
[52] U.S. Cl. ............................ 525/471; 525/537
[58] Field of Search ............ 525/537, 471; 264/290

[56] References Cited

U.S. PATENT DOCUMENTS

| | | |
|---|---|---|
| 3,819,582 | 6/1974 | Feasey . |
| 4,590,104 | 5/1986 | Zeiner et al. . |
| 4,645,826 | 2/1987 | Iizuka et al. . |
| 4,690,972 | 9/1987 | Johnson et al. ............ 525/471 |
| 4,716,212 | 12/1987 | Gaughan . |
| 4,785,057 | 11/1988 | Shiiki et al. . |
| 4,792,481 | 12/1988 | O'Connor . |
| 4,795,799 | 1/1989 | Cleary . |
| 4,826,906 | 5/1989 | Jatake et al. ............ 524/381 |
| 4,873,283 | 10/1989 | Satake et al. ............ 525/471 |
| 4,895,892 | 1/1990 | Satake et al. . |
| 4,895,893 | 1/1990 | Satake et al. . |
| 4,895,912 | 1/1990 | Satake et al. . |
| 4,895,924 | 1/1990 | Satake et al. . |
| 4,895,925 | 1/1990 | Satake et al. . |

FOREIGN PATENT DOCUMENTS

| | | |
|---|---|---|
| 135938 | 4/1985 | European Pat. Off. . |
| 189895 | 6/1986 | European Pat. Off. . |
| 285111 | 5/1988 | European Pat. Off. . |
| 270955 | 6/1988 | European Pat. Off. . |
| 274754 | 7/1988 | European Pat. Off. . |
| 280325 | 8/1988 | European Pat. Off. . |
| 285783 | 10/1988 | European Pat. Off. . |
| 285874 | 10/1988 | European Pat. Off. . |
| 287009 | 10/1988 | European Pat. Off. . |
| 293113 | 11/1988 | European Pat. Off. . |
| 3405523 | 8/1985 | Fed. Rep. of Germany . |
| 59-5101 | 2/1984 | Japan . |
| 60-58435 | 4/1984 | Japan . |
| 59-44968 | 11/1984 | Japan . |
| 61-221229 | 10/1986 | Japan . |

OTHER PUBLICATIONS

*Indian J. Chem.*, vol. 21A, May 1982, pp. 501-502.

Primary Examiner—Robert E. Sellers
Assistant Examiner—Helen F. Lee
Attorney, Agent, or Firm—Lowe, Price, LeBlanc & Becker

[57] ABSTRACT

A heat-resistant stretched film is obtained by stretching a resin composition comprising 100 parts by weight of a poly(arylene sulfide) of a substantially linear structure and 5 to less than 100 parts by weight of a melt-stable poly(arylene thioether-ketone). The poly(arylene sulfide) has a melt viscosity of at least 1,000 poises as measured at 310° C. and a shear rate of 200 sec$^{-1}$. The poly(arylene thioether-ketone) has predominant recurring units of the formula

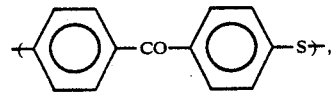

wherein the —CO— and —S— groups are bonded in the para position to each other through the benzene ring, and has the following physical properties (a)-(c):
(a) a melting point, Tm being 310°-380° C.;
(b) a melt crystallization temperature, Tmc (420° C./10 min) being at least 210° C. and a residual melt crystallization enthalpy, ΔHmc (420° C./10 min) being at least 10 J/g; and
(c) a reduced viscosity being 0.3-2 dl/g at 25° C. and a polymer concentration of 0.5 g/dl in 98% sulfuric acid.

4 Claims, 1 Drawing Sheet

HEAT-RESISTANT STRETCHED FILM AND PRODUCTION PROCESS THEREOF

This application is a continuation application of application Ser. No. 07/358,045, filed May 30, 1989, now abandoned.

FIELD OF THE INVENTION

This invention relates to a film excellent in heat resistance, and more specifically to a heat-resistant stretched film made of a composition, which comprises a poly(arylene sulfide) and a poly(arylene thioether-ketone), and also to a production process thereof.

The heat-resistant film of this invention can be used suitably, especially, in the field of electronic and electrical industry for its superb solder heat resistance, mechanical strength, surface smoothness, dimensional stability, electrical characteristics, moisture resistance, flex resistance, transparency, etc.

BACKGROUND OF THE INVENTION

In recent years, various polymer films have been used widely as electrical parts or devices, such as capacitor films and flexible printed circuit boards, in the field of electronic and electrical industry.

Flexible printed circuit boards (FPC) with electronic parts mounted thereon, such as IC, are required to have good service properties such as high heat resistance, moisture resistance, flex resistance, nonflammability, copper peeling resistance and the like. Most of these service properties are however dependent on the corresponding properties of the polymer film employed as a base material. The utility of polymer films is expected to expand further to such fields as requiring a high level of heat resistance, for example, insulating films for motors and transformers.

The polymer films used as these electrical parts or devices tend to be used after being soldered. Upon soldering, the temperature of fused solder reaches as high as about 260° C. There are, however, not many polymer films which can withstand such a high temperature processing. On the other hand, those having excellent solder heat resistance are costly and hence involve a practical problem as industrial materials from the economical viewpoint.

Poly(arylene sulfides) which may hereinafter be abbreviated as "PASs", such as poly(phenylene sulfides) which may hereinafter be abbreviated as "PPSs", have been known as resins having excellent heat resistance and chemical resistance, and biaxially-stretched films thereof have also been known conventionally (Japanese Patent Publication No. 5101/1984 and Japanese Patent Publication No. 44968/1984). The level of solder heat resistance required for practical application is such that no changes in external appearance, such as swelling and distortion, be observed when immersed in fused solder at 260° C. for 10 seconds. Under such high-temperature conditions, however, films made of a PAS alone inevitably undergo changes in external appearance so that they can hardly be regarded as films meeting the required level of solder heat resistance.

As heat-resistant resins having a melting point of about 300° C. or higher, polyether ether ketones which may hereinafter be abbreviated as "PEEKs" and polyether ketones which may hereinafter be abbreviated as "PEKs" have recently been developed. They can be easily formed into various shaped products such as films. For example, it has however been considered difficult to manufacture stretched films from a PEEK on an industrial scale because the PEEK contains aromatic rings in its backbone, its molecular chain is stiff and its stretchability is thus poor. In addition, these resins use expensive fluorine-substituted aromatic compounds such as 4,4'-difluorobenzophenone as their raw materials, and hence there exist limitations to the reduction of their costs.

The present inventors proceeded with an investigation to obtain stretched films from a PAS to which a resin having good heat resistance had been added with a view toward providing PAS films of improved solder heat resistance.

As a result, it has been found that a composition comprising a PEEK and a substantially-linear and high-molecular PAS provides a heat-resistant film by biaxial stretching (Japanese Patent Application No. 316306/1987). The composition, however, is not sufficient in the compatibility of both the resins and in addition, it should contain the expensive PEEK as a principal component in order to manufacture such heat resistant films stably by melt extrusion. Therefore, use of this resin is not advantageous from the economical viewpoint.

On the other hand, based on the assumption that poly(arylene thioether-ketones) (hereinafter abbreviated as "PTKs") could become heat-resistant thermoplastic resins like PEEKs and PEKs owing to their similarity in chemical structure, PTKs have been studied to some extent to date.

There are some disclosure on PTKs, for example, in German Offenlegungsschrift DE-3405523Al, Japanese Patent Application Laid-Open No. 58435/1985, European Patent Application Laid-Open No. 0,135,938 Al, U.S. Pat. No. 3,819,582, Indian J. Chem., 21A, 501–502 (May, 1982), Japanese Patent Application Laid-Open No. 221229/1986, U.S. Pat. No. 4,716,212, U.S. Pat. No. 4,690,972, European Patent Application Laid-Open No. 0,270,955 Al, European Patent Application Laid-Open No. 0,274,754 Al, European Patent Application Laid-Open No. 0,285,783 Al, European Patent Application Laid-Open No. 0,280,325 Al and European Patent Application Laid-Open No. 0,287,009 Al.

The PTKs described in the above publications, however, have poor melt stability and upon their melt processing, they may lose crystallinity or may undergo a crosslinking reaction or foaming, resulting in an increase in melt viscosity. It has hence been difficult to carry out melt forming or molding in accordance with a conventional melt processing technique such as injection molding or extrusion.

With the foregoing in view, the present inventors found that PTKs significantly improved in melt stability compared with the conventionally-known PTKs can be obtained by designing a polymerization process and conducting polymerization without any polymerization aid while paying attention to the selection of a charge ratio of monomers, the shortening of the polymerization time at high temperatures, the selection of a material for a polymerization reactor and optionally, by applying a stabilization treatment in a final stage of the polymerization. PTKs thus obtained are melt-stable ones which can be formed or molded by a conventional melt processing technique. (Japanese Patent Application Laid-Open No. 54031/1989).

These melt-stable PTKs alone or as compositions wherein 100 parts by weight of a PTK are blended with up to 100 parts by weight of another miscible thermoplastic resin can give lubricative stretched films having significant heat-resistance and strength (Japanese Patent Application Laid-Open No. 45439/1989). However, these PTKs also use expensive raw materials, leading to a problem that films made of one or more of such PTKs as principal component become inevitably costly.

With a view toward obtaining films having heat resistance superior to the films of PAS alone from a composition wherein a PAS, a principal component, is added with a resin having good heat resistance, the present inventors have proceeded with a further investigation.

It is necessary to add a resin superior in heat resistance to PAS in order to improve the heat resistance of PAS films. However, addition of such a heat resistant resin in a small quantity does not always contribute to the improvement of heat resistance compared with films of PAS alone. The state of mixing of both the components is important for the improvement of heat-resistance even if the resin is added in a small amount. In the state that a heat-resistant resin as a minor component has aggregated and is dispersed as an island component in the composition, the heat resistance of PAS forming a sea component can not be improved. That is to say, it is necessary for the heat-resistant resin as the minor component to form to some extent a continuous layer in the composition. Desired as a heat-resistant resin added to PAS is therefore a resin which has a structure chemically similar to that of PAS, does not undergo thermal decomposition during melt processing, can be mixed sufficiently without extreme difference in viscosity during melt mixing, and can be easily stretched into films.

Under the present situation, however, such a heat-resistant resin has not been obtained easily.

OBJECTS AND SUMMARY OF THE INVENTION

An object of this invention is to provide a heat-resistant stretched film having excellent solder resistance and also superb properties in mechanical strength, surface smoothness, dimensional stability, electrical characteristics, moisture resistance, flex resistance and transparency.

Another object of this invention is to produce a heat-resistant stretched film, which has practical utility from physical and economical standpoints, by melt forming and stably stretching a resin composition which is composed of PAS and PTK with PAS being as a principal component.

As a result of a further investigation, the present inventors have found that stretched films satisfying solder heat resistance sufficient to withstand high temperature conditions of 260° C. and 10 sec can be obtained from a resin composition comprising 100 parts by weight of a substantially-linear PAS which has a melt viscosity of 1,000 poises or more and has a substantially linear structure and 5 to less than 100 parts by weight of the before-mentioned melt-stable PTK. The present invention has been brought to completion on the basis of these findings.

Namely, the present invention can be summarized as follows.

I. A heat-resistant stretched film obtained by stretching a resin composition comprising:

[A] 100 parts by weight of a poly(arylene sulfide) of a substantially linear structure having a melt viscosity of at least 1,000 poises as measured at 310° C. and a shear rate of 200 sec$^{-1}$; and

[B] 5 to less than 100 parts by weight of a melt-stable poly(arylene thioether-ketone) containing predominant recurring units of the formula

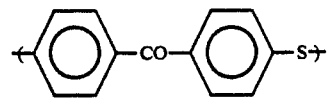

wherein the —CO— and —S— groups are bonded in the para position to each other through the benzene ring, said melt-stable poly(arylene thioether-ketone) having the following physical properties (a)–(c):

(a) a melting point, Tm being 310°–380° C.;

(b) a melt crystallization temperature, Tmc (420° C./10 min) being at least 210° C. and a residual melt crystallization enthalpy, ΔHmc (420° C./10 min) being at least 10 J/g, wherein Tmc (420° C./10 min) and ΔHmc (420° C./10 min) are determined by a differential scanning calorimeter at a cooling rate of 10° C./min, after the poly(arylene thioether-ketone) is held at 50° C. for 5 minutes in an inert gas atmosphere, heated to 420° C. at a rate of 75° C./min and then held for 10 minutes at 420° C.; and (c) a reduced viscosity being 0.3–2 dl/g at 25° C. and a polymer concentration of 0.5 g/dl in 98% sulfuric acid.

II. A process for the production of a heat-resistant stretched film, which comprises melt extruding at 340°–420° C. into a sheet-like product a composition comprising [A] 100 parts by weight of a poly(arylene sulfide) of a substantially linear structure having a melt viscosity of at least 1,000 poises as measured at 310° C. and a shear rate of 200 sec$^{-1}$ and [B] 5 to less than 100 parts by weight of a melt-stable poly(arylene thioether-ketone) containing predominant recurring units of the formula

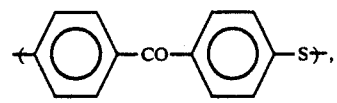

wherein the —CO— and —S— groups are bonded in the para position to each other through the benzene ring, said melt-stable poly(arylene thioether-ketone) having the above physical properties (a)–(c), quenching the sheet-like product at a cooling rate of at least 200° C./sec into an amorphous sheet-like product, stretching said amorphous sheet-like product at a draw ratio of 1.5–7 times in one direction or in biaxial directions simultaneously or sequentially at a draw ratio of 1.5–7 times in at least one direction in a temperature range of 80°–170° C., and then heat-setting the thus-stretched film at 270°–350° C.

Thus, the solder heat resistance of the film according to the present invention is improved compared with the film made of PAS alone and stretched films satisfying the recent requirement standard of solder heat resistance can be obtained easily and economically.

DETAILED DESCRIPTION OF THE INVENTION

Figure 1:
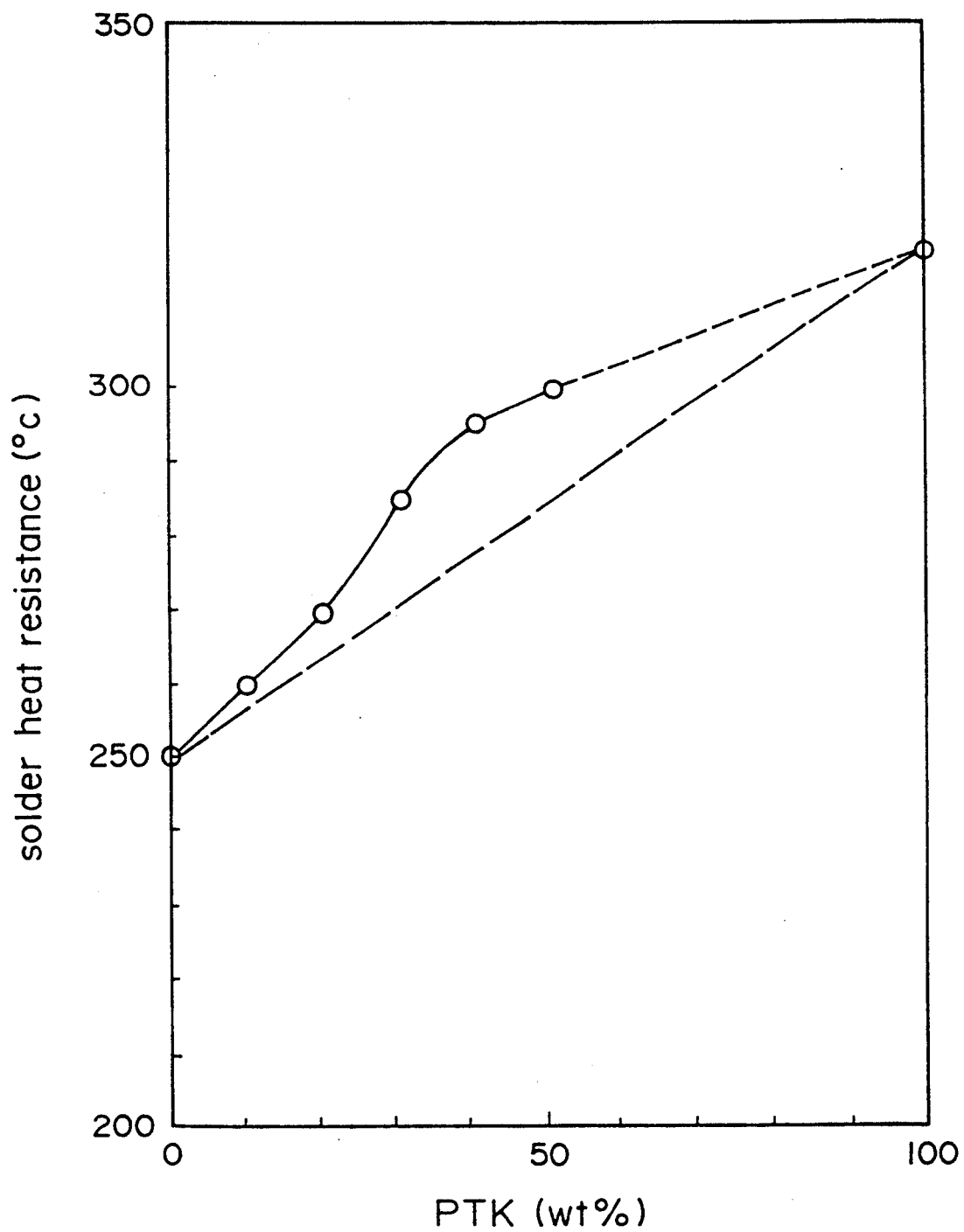
FIGURE 1 shows the solder heat resistance of biaxially-stretched films of the present invention obtained from compositions of PPS and PTK respectively.

The essential elements of this invention will hereinafter be described.

Components of the Resin Composition (PAS)

PASs useful in this invention are poly(arylene sulfides) of a substantially linear structure whose melt viscosities are at least 1,000 poises, preferably 2,500-30,000 poises as measured at 310° C. and a shear rate of 200 sec$^{-1}$.

Here, the expression "substantially linear structure" does not mean such a polymer having a crosslinking or branching structure as obtained through molecular-weight increasing treatment by oxidative crosslinking (curing) but does mean a polymer obtained from a monomer composed principally of a substantially bifunctional monomer. Polymers which have been cured within an extent not damaging the film forming property can also be included as polymers useful in this invention.

So long as the melt viscosity of the PAS is less than 1,000 poises, the film-forming property is inferior even when mixed with a melt-stable PTK, thereby making it difficult to obtain stretched films stably.

As PASs useful in the practice of this invention, those containing at least 50 wt. % of p-phenylene sulfide units are preferable and therefore, they may contain less than 50 wt. % of other recurring units for polymerization.

Illustrative examples of those component units include:

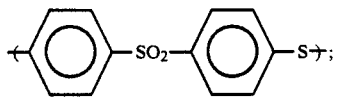

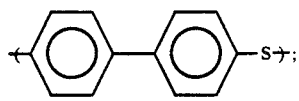

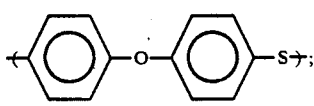

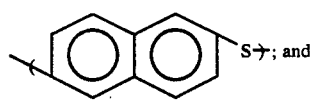

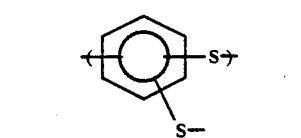

The content of a trifunctional (and tetra-functional and higher functional) units is preferably 1 mole % or less.

Such PASs of high polymerization degree can be produced for example by the process disclosed in U.S. Pat. No. 4,645,826 referred to above.

The process disclosed in U.S. Pat. No. 4,645,826 is for the production of a poly(arylene sulfide) having a melt viscosity of at least 1,000 poises, wherein the reaction between an alkali metal sulfide and a dihalogenated aromatic compound in an organic amide solvent is conducted at least in the following two steps:

(1) conducting the reaction at 180°-235° C. in the presence of water in an amount of 0.5-2.4 moles per mole of the alkali metal sulfide to form a poly(arylene sulfide) having a melt viscosity of 5-300 poises at a 50-98 mole % conversion of the dihalogenated aromatic compound; and (2) adding water to contain 2.5-7.0 moles of water per mole of the alkali metal sulfide and at the same time, raising the temperature to 245°-290° C., thereby proceeding with the reaction further.

Further, a block copolymer having predominant recurring units of p-phenylene sulfide

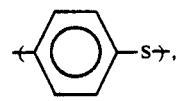

for instance, a block copolymer containing 70-95 mole % of

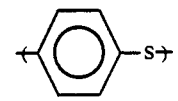

recurring units and 5-30 mole % of meta-phenylene sulfide

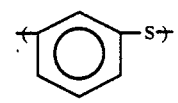

recurring units as blocks in the chain may also be used preferably. Such block copolymers having a high melt viscosity can be obtained, for example, by the process disclosed in U.S. Pat. No. 4,785,057.

The term "PASs" as used herein means those having a substantially linear structure and high molecular weight, unless otherwise specified. (PTK)

Chemical Structure of PTK

Melt-stable PTKs useful in the present invention are poly(arylene thioether-ketones) having predominant recurring units of the formula

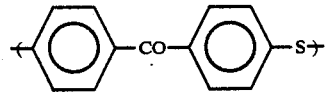

wherein the —CO— and —S— groups are bonded in the para position to each other through the benzene ring.

In order to be heat-resistant polymers comparable with PEEKs or PEKs, PTKs employed in this invention may preferably contain the above recurring units in a proportion greater than 50 wt. %, more preferably 60 wt. % or higher, most preferably 70 wt. % or higher. If the proportion of the recurring units is equal to or smaller than 50 wt. %, there is a potential problem that the resultant polymer may have lower crystallinity and thus reduced heat resistance correspondingly.

Exemplary recurring units of different kinds other than the above recurring units may include:

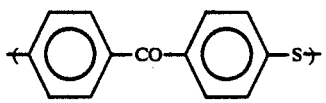

(except for the recurring unit in which the —CO— and —S— groups are bonded in the para position to each other through the benzene ring);

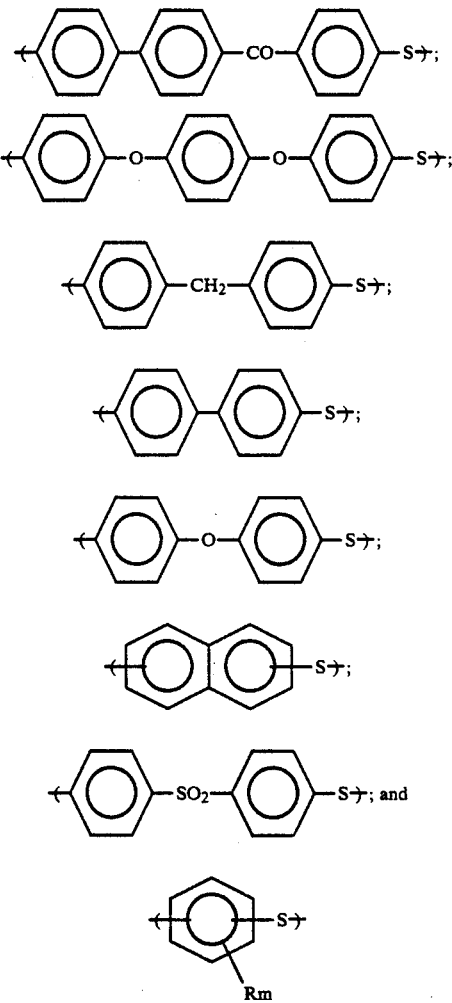

(wherein R means an alkyl group having 5 or less carbon atoms and m stands for an integer of 0–4).

It is desirable that the melt-stable PTK used in this invention is an uncured polymer, especially, an uncured linear polymer. The term "cure" as used herein means a molecular-weight increasing treatment by a method other than a usual polycondensation reaction, for example, by a crosslinking, branching or molecular-chain extending reaction, particularly, a molecular-weight increasing treatment by a high-temperature heat treatment or the like.

In general, curing causes a PTK to lose or decrease its melt stability and crystallinity. Accordingly, curing makes conventional melt processing of the PTK difficult and even if moldings such as films can be obtained from it, they are not preferable because they tend to become moldings having a low density and reduced crystallinity, that is, moldings which are far from substantially heat-resistant ones.

However, PTKs having a partially crosslinked and/or branched structure to such an extent still allowing the application of conventional melt processing techniques are also acceptable as PTKs usable in the present invention. For example, PTKs obtained by conducting polymerization in the presence of a small amount of a crosslinking agent (e.g., polychlorobenzophenone, polybromobenzophenone or the like) and PTKs subjected to mild curing are acceptable as melt-stable PTKS usable in this invention.

PHYSICAL PROPERTIES OF PTK

Outline of physical properties

The PTKs used in this invention may have the following physical properties.

(a) As an index of the characteristics of heat resistant polymers, their melting points, Tm range from 310° to 380° C.

(b) As an index of high melt stability of polymers permitting application of conventional melt processing techniques, their melt crystallization temperatures, Tmc (420° C./10 min) are at least 210° C. and their residual melt crystallization enthalpies, ΔHmc (420° C./10 min) at that time are at least 10 J/g, (c) When producing formed or molded articles such as films, an insufficient molecular weight makes shaping difficult due to drawdown upon melt forming or molding. A sufficiently high molecular weight is therefore be required. As an index of the molecular weights of the polymers, their reduced viscosities, $\eta_{red}$ should be within the range of 0.3–2 dl/g.

In the present invention, each reduced viscosity, $\eta_{red}$ is expressed by a value determined at 25° C. as solution having a polymer concentration of 0.5 g/dl in 98% sulfuric acid as a solvent.

(d) As an index of characteristics of high crystalline polymers, the densities of the polymers obtained in a crystallized form by annealing them at 280° C. for 30 minutes are at least 1.34 g/cm$^3$ at 25° C.

Details of physical properties (1) Heat resistance

The melting point, Tm of a polymer serves as an index of the heat resistance of the polymer.

The PTKs useful in the present invention have a melting point, Tm of 310°–380° C., preferably 320°–375° C., more preferably 330°–370° C. Those having a melting point, Tm lower than 310° C. are insufficient in heat resistance as heat resistant resins comparable to PEEKs and PEKs. On the other hand, it is difficult to perform melt processing of those having a melting point, Tm higher than 380° C. without decomposition. Such an excessively low or high melting point is not preferred.

(2) Melt stability:

The greatest feature of the PTKs useful in this invention resides in that they have melt stability sufficient to permit the application of conventional melt processing techniques.

All the conventional PTKs have low melt stability and tend to lose their crystallinity or to undergo crosslinking or carbonization, resulting in an increase in melt viscosity, upon their melt processing.

It is hence possible to obtain an index of the melt processability of a PTK by investigating the residual crystallinity of the PTK after holding it at an elevated temperature of its melt processing temperature or higher for a predetermined period of time. The residual crystallinity can be evaluated quantitatively by measuring the melt crystallization enthalpy with a differential scanning calorimeter (hereinafter abbreviated as "DSC"). Specifically, the melt crystallization temperature, Tmc (420° C./10 min) and the residual melt crystallization enthalpy, ΔHmc (420° C./10 min) of the PTK which are determined by a DSC at a cooling rate of 10° C./min after the PTK is held at 50° C. for 5 minutes in an inert gas atmosphere, heated to 420° C. at a rate of 75° C./min and then held for 10 minutes at 420° C. (higher than the melt processing temperature) can be used as a measure of its melt stability. In the case of a PTK having poor melt stability, it undergoes a crosslinking reaction or the like under the above high temperature condition of 420° C. and loses its crystallinity substantially.

The melt-stable PTKs usable in this invention are polymers whose residual melt crystallization enthalpies, ΔHmc (420° C./10 min) are preferably at least 10 J/g, more preferably at least 15 J/g, most preferably at least 20 J/g and whose melt crystallization temperatures, Tmc (420° C./10 min) are preferably at least 210° C., more preferably at least 220° C., most preferably at least 230° C.

A PTK, whose ΔHmc (420° C./10 min) is smaller than 10 J/g or whose Tmc (420° C./10 min) is lower than 210° C., tends to lose its crystallinity or to induce a melt viscosity increase upon its melt processing. Accordingly, it is difficult to apply conventional melt processing techniques to such a PTK and to say nothing of its single use, even when mixed in a PAS, it is still difficult to form it into a film.

(3) Molecular weight

As an index of the molecular weight of a polymer, a solution viscosity of the polymer, for instance reduced viscosity $\eta_{red}$, can be used.

When a PTK or a PTK composition is melt extruded into films, a drawdown becomes a problem upon melt processing.

Accordingly, the molecular weight of a PTK, which is correlated to the melt viscosity of the PTK, is an important factor governing its melt processability.

To permit the application of conventional melt processing techniques, high molecular-weight PTKs whose reduced viscosities, $\eta_{red}$ are preferably 0.3-2 dl/g, more preferably 0.5-2 dl/g are desired. Since a PTK whose $\eta_{red}$ is lower than 0.3 dl/g has a low melt viscosity and high tendency of drawdown, it is difficult to apply conventional melt processing techniques to such a low molecular-weight PTK. Further, stretched films obtained from such a PTK are insufficient in mechanical properties.

On the other hand, a PTK whose $\eta_{red}$ exceeds 2 dl/g is very difficult in production and processing.

(4) Crystallinity

As an index of the crystallinity of a polymer, its density is used.

A PTK which should be employed in this invention is desirably a polymer whose density (at 25° C.) is preferably at least 1.34 g/cm$^3$, more preferably at least 1.35 g/cm$^3$ when measured in the form of a crystallized product obtained by annealing at 280° C. for 30 minutes. PTKs in the form of crystallized products having a density lower than 1.34 g/cm$^3$ have a potential problem that they may have low crystallinity and hence insufficient heat resistance and their processability and mechanical properties of resulting stretched films may also be insufficient.

In particular, PTKs crosslinked to a high degree (e.g., the PTKs described in Japanese Patent Application Laid-Open No. 58435/1985 have lost crystallinity to a substantial extent and their densities are generally far lower than 1.34 g/cm$^3$.

Production Process of PTKs

Melt-stable PTKs usable in the present invention can be produced, for example, by polymerizing an alkali metal sulfide and a dihalogenated aromatic compound, preferably, dichlorobenzophenone and/or dibromobenzophenone, for a short period of time, in the substantial absence of a polymerization aid (a salt of a carboxylic acid, or the like), in an aprotic polar organic solvent, preferably, an organic amide solvent (including a carbamic amide or the like) and in a system having a water content much higher compared with the prior art polymerization processes reported to date while controlling the temperature profile suitably, and if necessary, by choosing the material of a reactor suitably.

Namely, melt-stable PTK usable in the present invention can each be produced suitably by subjecting an alkali metal sulfide and a dihalogenated aromatic compound consisting principally of 4,4'-dichlorobenzophenone and/or 4,4'-dibromobenzophenone to a dehalogenation or sulfuration reaction under the following conditions (a)-(c) in an organic amide solvent.

(a) the ratio of the water content to the amount of the charged organic amide solvent being 2.5-15 (mole/kg);

(b) the ratio of the amount of the charged dihalogenated aromatic compound to the amount of the charged alkali metal sulfide being 0.95-1.2 (mole/mole); and (c) the reaction temperature being 60°-300° C. with a proviso that the reaction time at 210° C. and higher is within 10 hours.

The melt-stable PTK can be obtained more suitably when a reactor at least a portion of which, said portion being brought into contact with the reaction mixture, is made of a titanium material.

A PTK improved still further in melt stability can also be obtained by adding, in a final stage of the polymerization, at least one halogen-substituted aromatic compound containing at least one substituent group having an electron-withdrawing property at least equal to —CO— group (preferably, 4,4'-dichlorobenzophenone and/or 4,4'-dibromobenzophenone employed as a monomer) and conducting a reaction (as a stabilization treatment in a final stage of the polymerization).

As described above, the melt-stable PTK usable in the present invention may preferably be an uncured polymer. It may however be a PTK in which a crosslinked structure and/or a branched structure has been incorporated to a certain minor extent. In order to obtain a PTK with a branched or crosslinked structure introduced therein, it is preferable to have a polyhalogenated compound, especially, a polyhalogenated benzophenone having at least three halogen atoms exist as a crosslinking agent in the polymerization reaction system in such an amount that the charge ratio of the monomeric dihalogenated aromatic compound to the polyhalogenated benzophenone ranges from 100/0 to 95/5 (mole/mole). If the charged amount of the polyhalogenated benzophenone is too much, physical properties of the resulting PTK, such as its melt processability, density and crystallinity, will be deteriorated. It is hence not preferable to charge such a polyhalogenated benzophenone too much.

Resin composition

The resin composition used as a raw material for stretched films in this invention is a composition obtained by blending 5 to less than 100 parts by weight, preferably 10 to less than 100 parts by weight, more preferably 20 to less than 100 parts by weight of a melt-stable PTK with 100 parts by weight of a PAS.

If the proportion of the PTK is too small, its effects will not be fully exhibited for the improvement of solder heat resistance, while an excess proportion is not economical. Stretched films fully satisfying the solder heat resistance can be obtained even if the proportion of the PTK is smaller than 100 parts by weight per 100 parts by weight of the PAS.

No particular limitations are imposed on the blending method. However, melt-blending and subsequent pelletization of PAS and PTK in predetermined amounts as powders or pellets are usually preferred. The melting temperature in this case is preferably 350°–420° C. If the melting temperature is lower than 350° C., PTK is not molten sufficiently and the viscosity increases in spite of the existence of PAS, which results in inconveniences, e.g. generation of melt fractures upon melt extrusion. On the other hand, when the melting temperature exceeds 400° C., melt stability of the PAS is not always sufficient.

Optional component

Thermoplastic Resin

Each composition of PAS and PTK usable in this invention may be mixed with thermoplastic resins to an extent not impairing the objects of the present invention.

As exemplary thermoplastic resins useful in the present invention, may be mentioned resins such as aromatic polyether ketones, e.g., PEEKs and PEKs, polyamides (including Aramids), polyamideimides, polyesters (including aromatic polyesters and liquid crystalline polyesters), polysulfones, polyether sulfones, polyether imides, polyarylenes, poly(phenylene ethers), polycarbonates, polyester carbonates, polyacetals, fluoropolymers, polyolefins, polystyrenes, polymethyl methacrylate, and ABS; as well as elastomers such as fluororubbers, silicone rubbers, olefin rubbers, acrylic rubbers, polyisobutylenes (including butyl rubber), hydrogenated SBR, polyamide elastomers and polyester elastomers. Among these thermoplastic resins are preferred aromatic polyether ketones such as PEEKs and PEKs, polysulfones, polyether sulfones, polyether imides, polyesters, polyolefins and polystyrenes from the viewpoints of physical properties and/or economy.

These thermoplastic resins may be used either singly or in combination. Although there are no particular limitations to the ratio of these resins, blending of one or more of these resins in a proportion up to 30 parts by weight per 100 parts by weight of the composition of PAS and PTK is preferred in view of heat resistance and/or economy.

Filler

Each composition of the present invention may contain, if desired, at least one of fibrous fillers and/or at least one of inorganic fillers within a range of 15 or less parts by weight per 100 parts by weight of the resin composition containing PAS and PTK. If the proportion of the filler exceeds 15 parts by weight, there is a potential problem that the processability may be reduced significantly and physical properties of the stretched film may be lowered. Such a large proportion is therefore not preferred.

As exemplary fibrous fillers, may be mentioned fibers such as glass fibers, carbon fibers, graphite fibers, silica fibers, alumina fibers, zirconia fibers, silicon carbide fibers and Aramid fibers; as well as whiskers such as potassium titanate whiskers, calcium silicate (including wollastonite) whiskers, calcium sulfate whiskers, carbon whiskers, silicon nitride whiskers and boron whiskers. Among these fibrous fillers, fibers such as glass fibers, carbon fibers and Aramid fibers are particularly preferred from the viewpoints of physical properties and/or economy.

As exemplary inorganic fillers, may be mentioned talc, mica, kaolin, clay, silica, alumina, silica-alumina, titanium oxide, iron oxides, chromium oxide, calcium silicate, calcium phosphate, calcium sulfate, magnesium carbonate, magnesium phosphate, silicon, carbon (including carbon black), graphite, silicon nitride, molybdenum disulfide, glass, hydro-talcite, ferrite, samarium-cobalt, neodium-iron-boron, etc., all, in a powder form.

These fibrous fillers and inorganic fillers may be used either singly or in combination.

Further optional components

Each PTK composition of the present invention may also be added optionally with additives such as stabilizers, rust inhibitors, lubricants, surface-roughening agents, ultraviolet absorbing agents, nucleating agents, mold releasing agents, colorants, coupling agents and/or antistatic agents. Addition of basic compounds such as hydroxides and oxides of Group IIA metals of the periodic table, for example calcium hydroxide, increases melt stability and therefore is preferable.

Process for the production of stretched films

The stretched film of the present invention can be produced by melt forming the resin composition containing PAS and melt-stable PTK into a sheet-like product by a conventional T-die method (extrusion using a T-die), inflation method (extrusion using a ring die) or hot pressing method, stretching the sheet-like product and then heat setting the same.

Specifically, a substantially amorphous sheet is obtained, for example, by feeding the above described composition to an extruder equipped with a T-die or ring die in the surrounding atmosphere or an inert gas atmosphere, extruding the composition in a molten state into a sheet-like product at 340°–420° C. and then quenching the product or by pressing the composition into a sheet-like product while heating and melting it on a hot press at 340°–420° C. and then quenching the product.

Such an amorphous sheet can be obtained by cooling the sheet in a molten state on a cooling drum or in a cooling medium such as water at a cooling rate of at least 200° C./min. Unless the composition is formed into an amorphous sheet, it is difficult to stretch it at a temperature range around the glass transition point of PAS.

Incidentally, the T-die extruder employed here may preferably be made of a non-ferrous corrosion resistant metal at areas where the extruder is brought into contact with the molten resin. A vented T-die extruder is more preferred.

The amorphous film thus obtained is stretched by a stretching machine such as rolls, a tenter or the like in a temperature range of 80°-170° C. and at a draw ratio of 1.5-7 times in one direction or in two directions, one being a desired direction (along a first axis) and the other being perpendicular to said desired direction (along a second axis) at a draw ratio of 1.5-7 times respectively.

When the film is stretched in biaxial directions, it can be stretched either sequentially or simultaneously.

When biaxial stretching is performed sequentially, films are stretched in the first stage in a temperature range of 80°-160° C., preferably 100°-150° C., at a draw ratio of 1.5-7 times, preferably 2-6 times and then stretched in the second stage in a temperature range of 90°-170° C., preferably 100°-160° C. at a draw ratio of 1.5-7 times, preferably 2-6 times in the direction perpendicular to the stretched direction in the first stage and after that, they are heat-set at 270° C. or higher, preferably from 280° C. to 350° C.

If the stretching temperature is lower than 80° C., it is difficult to perform the stretching and films tend to be broken frequently, while if the stretching temperature exceeds 170° C., films become fragile by crystallization and tend to be broken frequently. Judging from the orientation degree or tearings of the films, a preferable draw ratio in each stage falls within the range of 1.5-7 times. Preferred are films stretched 1.5-7 times in at least one direction, and particularly preferred are films stretched at a draw ratio of at least 4 times in terms of area ratio.

The stretching rate is preferably within a range of 10-10,000%/min.

When biaxial stretching is performed simultaneously, films are stretched in a temperature range of from 90° to 170° C., preferably 100°-150° C. at a draw ratio of 1.5-7 times, preferably 2-6 times in each of the machine and transverse directions. After the stretching, they are heat set at 270° C. or higher, preferably, from 280° C. to 350° C.

Films thus formed are heat set in a temperature range of from 270° C. to 350° C., preferably from 280° C. to 340° C. for 1-3,000 seconds, preferably 5-2,500 seconds while a stress (tensile force) being applied to control their deformation within ±20%.

After the heat setting, the resultant films may be subjected to thermal relaxation, if necessary, at 200°-340° C. for 1-3,000 seconds, preferably 5-2,000 seconds substantially under no stress.

As a result of the heat setting, the thus-stretched films have an increased density and further, improved heat resistance, dimensional stability and mechanical strength.

Films having excellent solder heat resistance cannot be obtained if the heat setting temperature is lower than 270° C.

To obtain solder heat resistance of 260° C./10 sec, it is necessary to heat set and crystallize films at a temperature corresponding to the solder heat resistance. The biaxially-stretched films are preferably heat set at a temperature approximately at least 20° C. higher than 260° C., that is, at 280° C. or higher.

A high-lubricity film whose coefficient of surface dynamic friction is 0.7 or smaller can be obtained, for example, by adding a small amount of an inorganic filler such as calcium carbonate, kaolin, clay, alumina, silica or titanium oxide to a resin composition of PAS and melt-stable PTK and then forming it into a film, by treating the surface of an unstretched film with an organic solvent having high compatibility with PAS and then stretching the thus-treated film, by roughening the surface of a stretched film by sand-blasting or with surface-roughening rolls.

The amorphous sheet obtained from the composition of PAS and melt-stable PTK starts crystallizing when it is heated from room temperature (25° C.) to 400° C. at a heating rate of 10° C./min by a DSC. In this case, two melt crystallization peaks appear corresponding respectively to the crystalline melting points of the PAS and PTK. On the other hand, there exists only one absorption peak corresponding to the glass transition point of an amorphous region when measured at a heating rate of 2° C./min with a dissipation factor (tan $\delta$) at 1 KHz.

A sheet made of the composition of PAS and PEEK also shows two crystallization peaks and two crystalline melting point peaks resulting from the PAS and PEEK and at the same time, with regard to tan $\delta$, two absorption peaks corresponding respectively to the glass transition points of PAS and PEEK are observed, thereby indicating that the composition of PAS and PEEK is inferior in compatibility to the composition of PAS and PTK.

In addition, it has also been observed under an electron microscope that a sheet obtained from a composition of PAS and PTK and that obtained from a composition of PAS and PEEK are each of a heterogenous system. However, the degree of dispersion of PTK to PAS is smaller in the case of the mixed system of PAS and PTK.

The composition of PAS and PTK shows a certain degree of compatibility as described above. There is a possibility that PTK, which is a minor component, forms a continuous phase in PAS.

Reflecting the superior compatibility of PTK with PAS to that of PEEK with PAS, a sheet can be formed stably by melt extrusion and further, a stretched film can be obtained easily in spite of the large difference in melting point between PAS and PTK. Besides, a sheet made of PTK alone has such a high crystallization rate that both edges of the amorphous sheet tend to crystallize upon casting subsequent to its die extrusion through a T-die and therefore, it is necessary to precisely control the forming conditions and stretching conditions for the amorphous sheet. Otherwise, its stretching has to be performed after cutting off both edges thereof. When the composition of PAS and PTK is used, it shows good film-forming ability so that a heat-resistant stretched film can be obtained easily. Even if the sheet has a large thickness, both edges thereof do not crystallize, thereby assuring easy production even for a thick heat-resistant film.

Stretched films

The stretched films of the present invention have usually an average thickness of 0.1-3,000 $\mu$m, more preferably 1-2,000 $\mu$m, most preferably 3-500 $\mu$m.

The stretched films according to this invention have solder heat-resistance under high temperature conditions of 260° C./10 sec, for example, the shrinkage factors of these films are smaller than approximately 5% at 270° C./10 sec and also have excellent dimensional stability, moisture resistance and electrical characteristics.

Application

The stretched films of the present invention may be used in a wide range of application fields, for example, as base films for magnetic recording materials (including films for vacuum deposition or sputtering and films for magnetic recording films of the perpendicular magnetization type), films for capacitors (films for chip-type capacitors, in particular), printed circuit boards (including both flexible and rigid types), insulating films, printer tapes, stampable sheets, various trays, containers, etc.

ADVANTAGES OF THE INVENTION

According to the present invention, stretched films having solder heat resistance of at least 260° C./10 sec and thus, being practically heat-resistant can be obtained economically. In addition, PTKs produced by the conventional techniques cannot permit application of melt processing techniques because of poor melt stability. While, in the present invention, stretched films having excellent physical properties such as solder heat resistance can be provided by blending a novel melt-stable PTK with PAS.

The heat-resistant stretched films of the present invention can be used in a wide range of fields where good heat resistance, strength and electrical characteristics are required.

EMBODIMENTS OF THE INVENTION

The present invention will hereinafter be described specifically by the following Examples, Comparative Examples and Experiments. It should however be borne in mind that the present invention is not necessarily limited to these Examples and Experiments.

EXPERIMENTS

Synthesis Experiment 1: Synthesis of Melt-Stable PTK

A titanium-lined reactor was charged with 90 moles of 4,4'-dichlorobenzophenone (hereinafter abbreviated as "DCBP; product of Ihara Chemical Industry Co., Ltd.), 90 moles of hydrated sodium sulfide (water content: 53.6 wt. %; product of Sankyo Kasei Co., Ltd.) and 90 kg of N-methylpyrrolidone (hereinafter abbreviated as "NMP") (content of coexistent water/NMP=5.0 moles/kg). After the reactor being purged with nitrogen gas, the resultant mixture was heated from room temperature to 240° C. over 1.5 hours and then maintained at 240° C. for 2 hours. In order to apply the stabilization treatment in the final stage of the polymerization, 4.5 moles of DCBP, 18 kg of NMP and 90 moles of water were added to the resultant mixture and reacted further at 240° C. for one hour.

After the reactor was cooled, slurry of a reaction mixture was drawn out and thrown into about 200 l of acetone to sediment a polymer. The polymer thus obtained was collected by filtration, washed with acetone and water twice respectively and then dehydrated, thereby obtaining a wet polymer. The thus-obtained wet polymer was dried at 80° C. for 12 hours under reduced pressure, so that Polymer P1 was obtained as a powder.

Regarding the thus-obtained Polymer P1, the melting point, ΔHmc (420° C./10 min), Tmc (420° C./10 min), density of an amorphous product (25° C.), density of annealed product (25° C.) and $\eta_{red}$ were 360° C., 43 J/g, 290° C., 1.30 g/cm$^3$, 1.35 g/cm$^3$ and 0.63 dl/g, respectively.

MEASURING METHOD OF PHYSICAL PROPERTIES

Measurement of melting points

With respect to the PTKs thus obtained, the melting point, Tm was measured as an index of its heat resistance. The measurement was performed in the following manner. About 10 mg of PTK (powder) was weighed. The sample was held at 50° C. for 5 minutes in an inert gas atmosphere, then heated up at a rate of 10° C./min so as to measure its melting point on a DSC (Model TC 10A; manufactured by Mettler Company).

Measurement of residual melt crystallization enthalpies

With respect to the PTK thus obtained, the residual melt crystallization enthalpy, ΔHmc (420° C./10 min) was measured as an index of its melt stability. Namely, the temperature corresponding to a peak of melt crystallization measured by the DSC is represented by melt crystallization temperature, Tmc (420° C./10 min) and while a residual melt crystallization enthalpy, ΔHmc (420° C./10 min) was determined by converting the area of the peak. Described specifically, about 10 mg of PTK (powder) was weighed. After holding the PTK at 50° C. for 5 minutes in an inert gas atmosphere, it was heated at a rate of 75° C./min up to 420° C. and held at that temperature for 10 minutes. While cooling the PTK at a rate of 10° C./min thereafter, its ΔHmc (420° C./10 min) and Tmc (420° C./10 min) were measured.

Measurement of density and solution viscosity

With respect to the PTKs thus obtained, the density was measured as an index of its crystallinity. Namely, PTK (powder) was first of all placed between two polyimide films ("Kapton ®"; product of E.I. du Pont de Nemours & Co., Inc.). It was preheated at 385° C. for 2 minutes and then press-formed at 385° C. for 0.5 minutes, both by a hot press. It was then quenched to obtain an amorphous sample whose thickness was about 0.15 mm. A part of the amorphous sample was used directly as a sample, while the remaining part was annealed at 280° C./30 min to use it as an annealed sample with an increased degree of crystallization. Its density was measured at 25° C. by means of a density gradient tube of a (zinc chloride/1% hydrochloric acid) system. Its solution viscosity (reduced viscosity, $\eta_{red}$) was measured as an index of its molecular weight.

Namely, the PTK sample was dissolved in 98% sulfuric acid to give a polymer concentration of 0.5 g/dl. The viscosity of the resultant solution was measured at 25° C. by means of a Ubbellohde viscometer.

MEASUREMENT OF HEAT RESISTANCE

Solder heat resistance

In accordance with the soldering heat resistance test (5.5.3) in the testing methods for copper-clad laminates for printed circuits prescribed in JIS C6481-1976, a film having a length of 30 mm and a width of 30 mm was dipped in (made contact with) a bath of molten solder of a fixed temperature, taken out from the bath and cooled at room temperature. Then, the existence or non-existence of any blisters and/or distortions on the film was visually observed. A shrinkage factor was obtained by measuring, by a microscope, the degree of deformation of the film taken out of the bath and cooled to the room temperature and comparing it with the, original, size of the film.

Measurement of Dimensional Change

With a thermomechanical analyzer, TMA 40 manufactured by Mettler Company, minute elongation or shrinkage behaviour of each film having a length of 10 mm and a width of 6 mm at 260° C. when heated from room temperature (23° C.) to 370° C. at a rate of 10° C./min under a small load of 0.02N was recorded on an enlarged scale. Temperature and expansion/shrinkage behaviour was continuously recorded by plotting temperatures along the axis of abscissas and elongation/shrinkage behaviour along the axis of ordinates.

EXAMPLES 1-3 & COMPARISON EXAMPLES 1-5

Twenty parts by weight of PTK (Polymer P1 obtained in Synthesis Experiment 1) added with 0.5 wt. % of calcium hydroxide powder having an average particle size of 1.6 μm were mixed uniformly with 80 parts by weight of a poly(phenylene sulfide) resin (product of Kureha Chemical Industry Co., Ltd.; melt viscosity at 310° C. and 200 sec$^{-1}$: 6,800 poises) in a Henschel mixer, thereby obtaining a resin composition.

The resin composition was extruded into strands at a melt temperature of 370° C. and an extrusion output of 8 kg/hour by means of a small biaxial extruder equipped with a nozzle having three holes of 3 mm across, then cooled and pelletized., Pellets thus obtained were crystallized at 155° C. for 2 hours.

The above-described pellets were extruded in a molten state by means of an extruder which has a cylinder diameter of 35 mmφ and L/D of 28 and is equipped with a T-die having a lip clearance of 0.5 mm and a width of 250 mm. Melt extrusion temperature was set at 360° C. The melt molded resin was extruded on a cast drum whose temperature was about 80° C. and cooled by means of an electrostatic application of 5.6 KV through a pinning apparatus. The amorphous sheet thus obtained had an average thickness of 150 μm.

According to the DSC chart of thus-obtained amorphous sheet measured at increased temperatures from 25° C. to 380° C. at a rate of 10° C./min, two respective crystallization peaks and crystalline melting peaks appear, which indicates that PPS crystals and PTK crystals are generated and exist independently. Namely, the crystallization peaks include a peak of 146° C. derived from PPS and a peak of 173° C. derived from PTK, while the crystalline melting peaks, which appeared at 280° C., was derived from PPS and the other one at 340° C. was derived from PTK. Although these crystallization peaks and crystalline melting peaks are rather broad, each of the DSC crystallization and crystalline melting curves presents double peaks.

The quenched amorphous sheet thus obtained was biaxially stretched three times in both the machine and transverse directions at a stretching temperature of 115° C. by means of a biaxial stretching machine manufactured by Toyo Seiki Seisaku-Sho Ltd.

Biaxially-stretched films thus obtained were fixed at the entire peripheries thereof on a metal frame and their heat setting was conducted under the fixed length for 10 minutes in a Geer oven, changing the heat setting temperature in a range of 260°-320° C. as shown in Table 1. The films had a thickness of 16 μm.

For comparison (Comparative Examples 1, 3, 4 and 5), an amorphous sheet of PPS alone was formed under substantially same conditions except that the melt temperature was changed to 320° C. without addition of calcium hydroxide. The quenched substantially the amorphous sheet obtained was stretched three-times in both the machine and transverse directions at a stretching temperature of 100° C. by a similar biaxial stretching machine. Samples of the film thus obtained were heat-set similarly at varied heat-setting temperatures. Heat-setting of the biaxially stretched film of PPS alone at 320° C. was, however, impossible because of the melting of the film. A similar problem was also observed at 310° C. The upper limit of the heat setting temperature was up to 300° C. accordingly.

Observation results of changes in external appearance of the biaxially stretched films when immersed in a solder bath are collectively shown in Table 1. In addition, dimensional changes (%) of the thus-obtained films at 260° C. were also measured by the thermomechanical analyzer, TMA 40 manufactured by Mettler Company. The results are also shown collectively in Table 1.

TABLE 1

| | | Comparative Example 1 | Comparative Example 2 | Comparative Example 3 | Example 1 | Comparative Example 4 | Example 2 | Comparative Example 5 | Example 3 |
|---|---|---|---|---|---|---|---|---|---|
| Heat setting temperature (°C.) | | 260 | | 280 | | 300 | | 320 | |
| Composition (PTK/PPS) | | 0/100 | 20/80 | 0/100 | 20/80 | 0/100 | 20/80 | 0/100 | 20/80 |
| Temperature of solder bath, °C. | | | | | | | | | |
| 260 | Blisters, distortions | Observed | Observed | Not observed | Not observed | Not observed | Not observed | Film was broken under the heat-setting condition | Not observed |
| | Shrinkage factor (%) | 14.7 | 5.5 | 2.7 | 1.0 | 2.0 | 2.1 | — | 2.1 |
| 270 | Blisters, distortions | many | many | Observed | Not observed | Observed | Not observed | — | Not observed |
| | Shrinkage factor (%) | 30.7 | 14.0 | 6.6 | 3.0 | 6.5 | 2.4 | — | 2.1 |
| 280 | Blisters, distortions | — | many | — | Observed | Observed | Not observed | — | Not observed |
| | Shrinkage factor (%) | — | 19.9 | — | 22.9 | 6.9 | 2.1 | — | 1.9 |
| 290 | Blisters, distortions | — | — | — | — | Observed | slightly observed | — | Not observed |

TABLE 1-continued

|  | Comparative Example 1 | Comparative Example 2 | Comparative Example 3 | Example 1 | Comparative Example 4 | Example 2 | Comparative Example 5 | Example 3 |
| --- | --- | --- | --- | --- | --- | --- | --- | --- |
| Shrinkage factor (%) | — | — | — | — | large | 8.1 | — | 4.3 |
| Dimensional change at 260° C. by TMA, % Expansion/shrinkage (+) (−) | −8 | −8 | −3 | −1 | +10 | ±0 | — | +2 |

As is apparent from Table 1, solder heat resistance was slightly insufficient when the heat-setting temperature of the biaxially-stretched film was low, i.e., 260° C. (Comparative Example 2), even when the composition of PPS and PTK was used. On the other hand, when heat-setting temperature was 280° C. (Example 1), 300° C. (Example 2) and 320° C. (Example 3), respectively, films exhibited extremely good heat resistance, as evident from their shrinkage factors of about 2% or smaller under 260° C./10 sec, although PTK was a minor component. The films heat-set at 320° C. did not show any blisters or distortions and had a small shrinkage factor even at the high temperature of 290° C./10 sec, so that they had solder heat resistance sufficient for exposure to molten solder for a short time.

On the other hand, the film of PPS alone developed blisters and distortions even under the conditions of 260° C./10 sec (Comparative Example 1). The use of the higher heat-setting temperatures (Comparative Examples 3, 4 and 5) was still unable to bring about sufficient heat resistance, because the solder heat resistance was not improved to any significant extent or films were broken under the above heat-setting conditions.

EXAMPLE 4

Biaxially-stretched films were obtained in a similar manner as in Examples 1-3 except that the blending ratio of PTK was changed to 10-50 wt. %. The thus-obtained films were heat-set for 5 minutes respectively at their possible maximum temperatures. Namely, the heat-setting temperatures were 300° C. at PTK/PPS = 10/90, 320° C. at 20/80 and 30/70, 330° C. at 40/60, and 340° C. at 50/50.

With respect to each of the thus-obtained films having a thickness of about 15 μm, solder heat-resistance (temperature at which substantially no changes in external appearance were observed when dipped in a solder bath for 10 seconds) was measured. At the same time, the shrinkage factor was measured. FIGURE 1 shows variations of solder heat resistance as a function of PTK content by using as a guide the maximum withstandable temperature corresponding to a shrinkage factor of approximately 4-5%.

As is apparent from FIGURE 1, it has been found that even if PTK is blended in a small amount, the solder heat resistance is enhanced markedly and the blending of PPS and PTK can bring about synergistic improvements to the heat resistance of biaxially stretched films to be obtained.

EXAMPLE 5

Using the amorphous sheet obtained in Example 1, composed of PPS and PTK at a weight ratio of 80:20 and having an average thickness of 150 μm, uniaxial stretching was performed by a stretching machine equipped with preheating rolls controlled at 90° C. and ceramics-coated stretching rolls maintained at 118° C. At a draw ratio of 3.5 times, a uniaxially stretched film having an average thickness of 43 μm was obtained.

The uniaxially stretched film thus obtained was fixed at the entire peripheries thereof on a metal frame and its heat setting was conducted under the fixed length for 10 minutes in a Geer oven controlled at 320° C.

The film thus obtained was transparent. That film was immersed in a solder bath of 280° C. for 10 seconds to investigate its solder heat resistance. Neither blisters nor distortions were observed, so that the film was found to have solder heat resistance of 280° C.

EXAMPLE 6

Sixty parts by weight of PPS employed in Example 1 and 40 parts by weight of PTK (Polymer P1 used in Example 1) added with 0.5 wt.% of calcium hydroxide powder having an average particle size of 0.8 μm were mixed uniformly in a Henschel mixer, thereby obtaining a resin composition.

The resin composition was pelletized in a similar manner as in Example 1, crystallized and then extruded in a molten state to obtain an amorphous sheet of 150 μm in average thickness. Melt extrusion temperature was set at 370° C.

The amorphous sheet thus obtained was uniaxially stretched 4.5 times in the machine direction at a stretching temperature of 130° C. by a biaxial stretching machine while maintaining its width unchanged and a uniaxially stretched film of 34 μm in thickness was obtained. That film was fixed at the entire peripheries thereof on a metal frame and was heat set at 330° C. for 10 minutes.

The thus-obtained film was transparent. The solder heat resistance of that film at 290° C was evaluated. Neither blisters nor distortions were observed, so that it was found to have solder heat resistance of 290° C.

What is claimed is:

1. A heat-resistant stretched film obtained by stretching a resin composition comprising:
   (A) 100 parts by weight of a poly(arylene) sulfide of a linear structure containing at least 50 weight percent of p-phenylene sulfide units and having a melt viscosity of at least 1,000 poises as measured at 310° C. and a shear rate of 200 sec$^{-1}$; and
   (B) 5 to less than 100 parts by weight of a melt-stable poly(arylene thioether-ketone) containing greater than 50 weight percent of recurring units of the formula

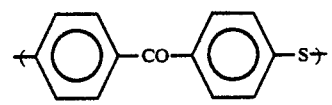

wherein the —CO— and —S— groups are bonded in the para position to each other through the benzene ring, said melt-stable poly(arylene thioether-ketone) having the following physical properties (a)-(c):
(a) a melting point, Tm being 310°-380° C.;
(b) a melt crystallization temperature, Tmc (420° C./10 min) being at least 210° C. and a residual melt crystallization enthalpy, ΔHmc (420° C./10 min) being at least 10 J/g; and
(c) a reduced viscosity being 0.3-2 dl/g at 25° C. and a polymer concentration of 0.5 g/dl in 98% sulfuric acid, said film having been stretched at a draw ratio of 1.5-7 in at least one direction and then heat set at 270°-350° C., and having a solder heat resistance of at least 260° C./10 sec.

2. The film as claimed in claim 1, wherein the poly(arylene sulfide) is a block copolymer composed of 70-95 mole % of para blocks containing the recurring units

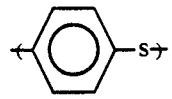

and 5-30 mole % of meta blocks containing the recurring units of

3. The film as claimed in claim 1, wherein the poly(arylene thioether-ketone) has a density of at least 1.34 g/cm$^3$ at 25° C. when measured in the form of a product crystallized by annealing at 280° C. for 30 minutes.

4. The film as claimed in claim 1, wherein the poly(arylene thioether-ketone) is an uncured polymer.

* * * * *